US009970972B2

(12) United States Patent
Baicry et al.

(10) Patent No.: US 9,970,972 B2
(45) Date of Patent: May 15, 2018

(54) DEVICE FOR MEASURING AN ELECTRIC FIELD IN A CONDUCTING MEDIUM

(71) Applicant: Commissariat â l'Energie Atomique et aux Energies Alternatives, Paris (FR)

(72) Inventors: Mathieu Baicry, Sassenage (FR); François Bertrand, La Tronche (FR); Matthieu Le Prado, Saint-Marcellin (FR); Jean-Michel Leger, Villard Bonnot (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 301 days.

(21) Appl. No.: 15/045,381

(22) Filed: Feb. 17, 2016

(65) Prior Publication Data
US 2016/0238645 A1  Aug. 18, 2016

(30) Foreign Application Priority Data

Feb. 17, 2015 (FR) ..................................... 15 51296

(51) Int. Cl.
*G01R 33/09* (2006.01)
*G01R 29/08* (2006.01)
(Continued)

(52) U.S. Cl.
CPC ............. *G01R 29/08* (2013.01); *G01R 15/20* (2013.01); *G01R 29/0878* (2013.01); *G01V 3/088* (2013.01)

(58) Field of Classification Search
CPC .. G01R 33/09; G01R 33/0052; G01R 33/093; G01R 33/07; G01R 33/098; G01R 33/0011; G01R 33/02; G01R 19/0092; G01R 33/04; G01R 33/091
USPC .... 324/754.27, 530, 144, 93, 399, 510, 511, 324/750.11, 750.24, 756.05, 301, 389, 324/207.21, 244–258, 332–365
See application file for complete search history.

(56) References Cited

U.S. PATENT DOCUMENTS

| 434,487 A | * | 8/1890 | Browning ............... B25B 1/125 269/208 |
| 3,641,427 A | | 2/1972 | Pittman et al. |

(Continued)

FOREIGN PATENT DOCUMENTS

FR  2690750 A1  11/1993

OTHER PUBLICATIONS

Preliminary Search Report filed in FR 15/51296 dated Jan. 8, 2016; 2 pgs.

*Primary Examiner* — Jermele M Hollington
*Assistant Examiner* — Taqi Nasir
(74) *Attorney, Agent, or Firm* — Moreno IP Law LLC

(57) ABSTRACT

A device for measuring an electric field in a conducting medium, including: an insulating enclosure; first, second, and third pairs of electrodes, the electrodes of a same pair being arranged on opposite external walls of the enclosure, and the electrodes of the first, second, and third pairs being centered on first, second, and third orthogonal axes; a first conductive coil; a first pair of switches enabling to alternately connect the first coil between the electrodes of the first, of the second, and of the third pair of electrodes; and a single magnetometer.

10 Claims, 3 Drawing Sheets

(51) Int. Cl.
*G01R 15/20* (2006.01)
*G01V 3/08* (2006.01)

(56) References Cited

U.S. PATENT DOCUMENTS

| | | | | |
|---|---|---|---|---|
| 5,731,703 A * | 3/1998 | Bernstein | ............... | G01R 33/02 |
| | | | | 324/256 |
| 6,606,908 B2 * | 8/2003 | Johann | ................... | B64G 1/242 |
| | | | | 701/13 |
| 8,198,899 B2 * | 6/2012 | Lindqvist | ............... | G01V 3/083 |
| | | | | 324/365 |
| 8,896,313 B2 * | 11/2014 | Lindqvist | ................. | G01V 3/12 |
| | | | | 324/334 |
| 2009/0001986 A1 * | 1/2009 | Besson | .................. | G01V 3/083 |
| | | | | 324/335 |
| 2010/0097058 A1 * | 4/2010 | Getty | .................... | G01R 33/04 |
| | | | | 324/244 |
| 2013/0241546 A1 * | 9/2013 | Fu | .......................... | G01R 33/02 |
| | | | | 324/259 |
| 2016/0238645 A1 * | 8/2016 | Baicry | .................. | G01R 15/20 |
| 2017/0127979 A1 * | 5/2017 | Azaria | ................ | A61B 5/1123 |
| 2017/0234719 A1 * | 8/2017 | Tham | ...................... | G01F 1/584 |
| | | | | 73/1.16 |

* cited by examiner

DEVICE FOR MEASURING AN ELECTRIC FIELD IN A CONDUCTING MEDIUM

This application claims the priority benefit of French Patent application number 15/51296, filed on Feb. 17, 2015, the contents of which is hereby incorporated by reference in its entirety to the maximum extent allowable by law.

BACKGROUND

The present application relates to a device for measuring an electric field in a conducting medium. It particularly applies to undersea electric field measurements.

DISCUSSION OF THE RELATED ART

An offshore electric field measurement device, or sea electrometer, comprising two immersed electrodes distant by a distance 1, connected to a voltage measurement device, has already been provided. To measure an electric field E in the area located between the two electrodes, voltage U between the electrodes is measured. Field E can be deduced from this measurement by formula E=U/d. Electrometers of this type are called "voltage measurement" electrometers.

A disadvantage of voltage measurement electrometers is that only a very small portion of the current propagating in the conducting medium formed by the sea water is deviated in the voltage measurement device, which raises metrology problems. Further, voltage measurement electrometers are generally bulky. Indeed, to obtain a satisfactory signal-to-noise ratio, distance d separating the two electrodes should be relatively large, typically in the range from a few meters to a plurality of kilometers.

To overcome these disadvantages, another type of device of electric field measurement in a conducting medium, called "current measurement" device, which determines the density of current generated, under the effect of the electric field, in a fixed conducting medium volume, is provided.

A device of this type is for example described in French patent N°9102273 of the applicant (filed on Feb. 26, 1991). Devices of this type, which will be called current measurement electrometers, may be more compact than voltage measurement electrometers, and may further have a better sensitivity.

The present application more specifically aims at current measurement electrometers. It is indeed needed to improve certain aspects of existing current measurement electrometers.

SUMMARY

Thus, an embodiment provides a device for measuring an electric field in a conducting environment, comprising: an insulating enclosure; first, second, and third pairs of electrodes, the electrodes of a same pair being arranged on opposite external walls of the enclosure, and the electrodes of the first, second, and third pairs being centered on first, second, and third orthogonal axes; a first conductive coil; a first pair of switches enabling to alternately connect the first coil between the electrodes of the first, of the second, and of the third pair of electrodes; and a single magnetometer.

According to an embodiment, the device further comprises: second and third conductive coils; and second and third pairs of switches respectively enabling to alternately connect the second coil between the electrodes of the first, of the second, and of the third pair of electrodes, and of alternately connecting the third coil between the electrodes of the first, of the second, and of the third pair of electrodes, wherein the magnetometer is capable of measuring a magnetic field induced by the flowing of currents through the first, second, and third coils.

According to an embodiment, the first, second, and third coils are respectively series-connected to first, second, and third variable resistors.

According to an embodiment, the device comprises a control circuit capable of successively implementing the steps of: controlling the switches so that the first, second, and third coils are not connected to the electrodes, and measuring the module and the direction of the ambient magnetic field; and controlling the variable resistors so that the flowing of a current in the parallel association of a first branch comprising the first variable resistor and the first coil, of a second branch comprising the second variable resistor and the second coil, and of a third branch comprising the third variable resistor and the third coil, induces, at the level of the magnetometer, a magnetic field substantially parallel to the ambient magnetic field.

According to an embodiment, the control circuit is further capable of successively implementing the steps of: controlling the switches so that the first, second, and third branches are connected in parallel between the electrodes of the first pair of electrodes and are not connected to the second and third pairs of electrodes, and then measuring the module of the magnetic field at the level of the magnetometer; controlling the switches so that the first, second, and third branches are connected in parallel between the electrodes of the second pair of electrodes and are not connected to the first and third pairs of electrodes, and then measuring the module of the magnetic field at the level of the magnetometer; and controlling the switches so that the first, second, and third branches are connected in parallel between the electrodes of the third pair of electrodes and are not connected to the first and second pairs of electrodes, and then measuring the module of the magnetic field at the level of the magnetometer.

According to an embodiment, the first, second, and third coils have non-parallel longitudinal axes, for example, substantially orthogonal.

According to an embodiment, the magnetometer is a scalar magnetometer.

According to an embodiment, the device comprises a control circuit capable of successively implementing the steps of: controlling the switches so that the first coil is not connected to the electrodes, and performing a vector measurement of the ambient magnetic field; controlling the switches so that the first coil is connected between the electrodes of the first pair of electrodes and is not connected to the second and third pairs of electrodes, and then performing a vector measurement of the magnetic field at the level of the magnetometer; controlling the switches so that the first coil is connected between the electrodes of the second pair of electrodes and is not connected to the first and third pairs of electrodes, and then performing a vector measurement of the magnetic field at the level of the magnetometer; and controlling the switches so that the first coil is connected between the electrodes of the third pair of electrodes and is not connected to the first and second pairs of electrodes, and then performing a vector measurement of the magnetic field at the level of the magnetometer.

According to an embodiment, the magnetometer is a vector magnetometer.

According to an embodiment, the electrodes have substantially the same surface area, and a same distance separates the two electrodes of each of the three pairs of electrodes.

The foregoing and other features and advantages will be discussed in detail in the following non-limiting description of specific embodiments in connection with the accompanying drawings.

DETAILED DESCRIPTION

Figure 1:
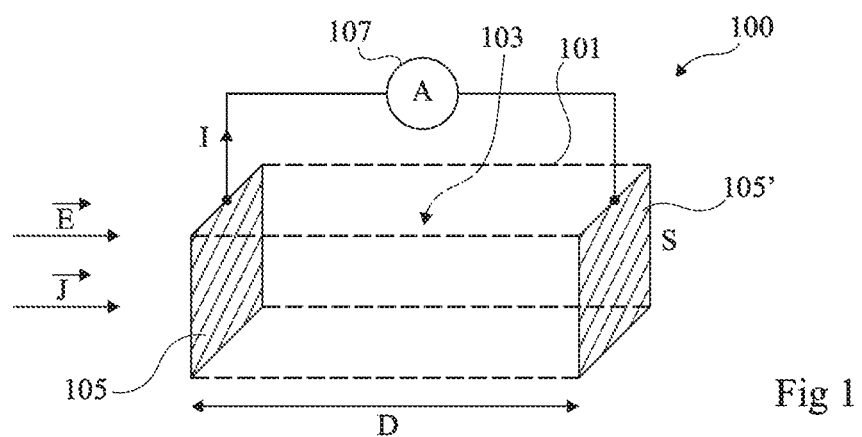
FIG. 1 schematically shows a current-measurement electrometer.

The same elements have been designated with the same reference numerals in the different drawings and, further, the various drawings are not to scale. Further, only those elements which are useful to the understanding of the described embodiments have been detailed. In particular, the control and/or analysis and processing circuits of the described electrometers have not been detailed, the forming of these circuits being within the abilities of those skilled in the art having read the present description. Further, in the following description, when reference is made to terms qualifying absolute positions, such as terms "front", "rear", "top", "bottom", "left", "right", etc., or relative positions, such as terms "above", "under", "upper", "lower", etc., or to terms qualifying directions, such as terms "horizontal", "vertical", etc., it is referred to the orientation of the drawings. Further, in the following description, unless otherwise specified, expressions "approximately", "substantially", and "in the order of" mean to within 10%, preferably to within 5%.

FIG. 1 schematically shows an example of a current-measurement electrometer 100 intended to be placed in a conducting medium where an electric field is desired to be measured, for example, sea water. Electrometer 100 comprises a tightly closed enclosure 101, shown in dotted lines in the drawing, delimiting a volume 103 of an insulating medium, for example, air or vacuum. Two electrodes 105 and 105' are arranged outside of enclosure 101, on opposite surfaces of the enclosure, so that each electrode has a surface in contact with the conducting medium when the electrometer is submerged. In this example, the two electrodes 105 and 105' are approximately planar and parallel to each other, have substantially the same surface area S, and are separated by a distance D. A current-measurement device 107 connects the two electrodes.

In operation, electrometer 100 is submerged in a conducting medium submitted to an electric field E which is desired to be measured. Under the effect of electric field E, a current of density $J=\alpha*\sigma_e*E$ flows in the conducting medium, $\sigma_e$ designating the electric conductivity of the conducting medium, and $\alpha$ being a coefficient which is a function of the ratio of electric conductivity $\sigma_c$ of the sensor to electric conductivity $\sigma_e$ of water, with $\sigma_c=D/(S*Z_c)$, $Z_c$ designating the impedance of the electrometer, $Z_c=Z_{elec}+Z_{int}$, $Z_{elec}$ being the impedance of the electrodes of the electrometer, and $Z_{int}$ being the impedance of the element(s) connected between the electrodes, including at least current-measurement device 107.

Electrodes 105 and 105' enable to channel current density J generated in the conducting medium under the effect of field E. Channeled current I flowing through electrodes 105 and 105' is equal to I=S*J. Current I may be measured by current-measurement device 107.

Conductivity $\sigma_e$ of the conducting medium where electrometer 100 is used is assumed to be known and, knowing the characteristics of the electrometer, coefficient $\alpha$ may be determined. Electric field E can then be deduced from the measurement of current I by formula $E=I/(S*\alpha*\sigma_e)$. The electrometer may comprise processing means, not shown, capable of determining electric field E from the measurement of current I.

Figure 2:
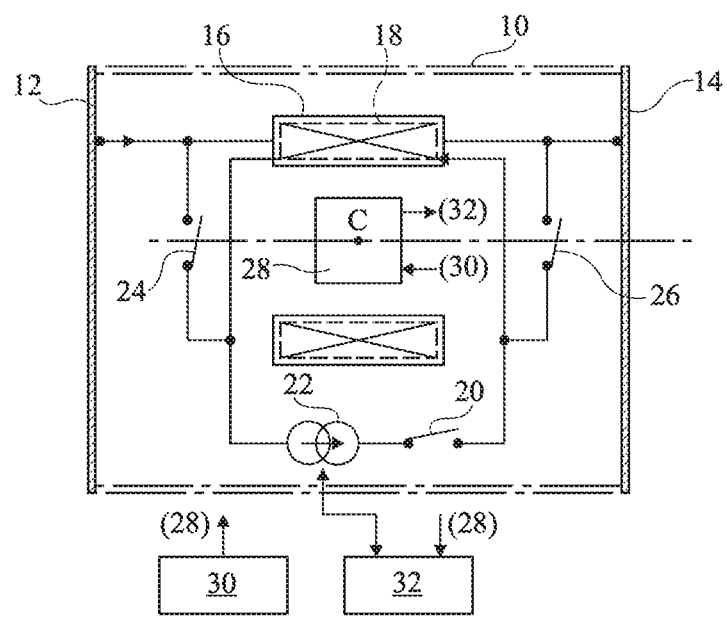
FIG. 2 shows in more detailed fashion an example of a current-measurement electrometer described in above-mentioned French patent N°9102273.

FIG. 2 shows in more detailed fashion an example of a current-measurement electrometer described in above-mentioned French patent N°9102273. In this example, the measurement of the current channeled by the electrodes is performed by measuring the magnetic field generated by a coil having the channeled current flowing therethrough. The device of FIG. 2 comprises two electrodes 12 and 14 placed on opposite surfaces of an insulating enclosure 10, and connected to a measurement device internal to enclosure 10. A first coil 16 is series-connected with electrodes 12 and 14. The device of FIG. 2 further comprises a second coil 18 of same longitudinal axis and of same geometric center C as coil 16. As then conduct an identical current, coils 16 and 18 generate identical magnetic fields, of opposite directions. Coil 18 is connected via a switch 20 to a variable current source 22. Two switches 24 and 26 enable to connect coils 16 and 18 in parallel. A magnetometric sensor 28 is arranged inside of coils 16, 18. This sensor is connected to control means 30 which provide, among others, the excitation signals necessary to the sensor operation, and with analysis and processing means 32 which enable to determine an electric field based on the measurement of the magnetic field.

To determine an electric field in a conducting medium, insulating enclosure 10 is plunged into the conducting medium and positioned along the axis of the field which is desired to be measured. The axis connecting the electrodes determines the direction of the measured electric field component.

First, switch 20 is off, and switches 24 and 26 are on. Coils 16 and 18 are thus connected in parallel and the current originating from electrodes 12 and 14 is equal in each of them. The coils being identical and conducting identical currents of opposite directions, the magnetic fields generated by each of them are identical but of opposite direction. Magnetometer 28 thus only measures the local magnetic field which is recorded and stored in the memory.

In a second step, switches 24 and 26 are off while switch 20 is on. Coil 16, conducting a current originating from electrodes 12 and 14, generates a magnetic field which superposes to the local magnetic field. As it is controlled by analysis and processing means 32, current source 22 delivers a current having an intensity such that the magnetic field generated by coil 18 cancels the magnetic field generated by coil 16 under the effect of the current channeled by the electrodes. When the magnetic field measured by sensor 28 is equal to the previously-recorded value of the local magnetic field, the intensity of the current output by current source 22 is equal to the intensity of the current flowing through coil 16. Knowing the value of the current flowing through coil 16, the electric field in the axis connecting electrodes 12 and 14 of the device can then be determined.

FIG. 3 of above-mentioned French patent N°9102273 shows a variation of the electric field measurement device of FIG. 2, enabling to determine two perpendicular components of the electric field. However, this device is relatively complex. Indeed, the measurement device internal to insulating enclosure 10 is formed by duplicating the architecture of a unidirectional measurement device. Thus such a device comprises at least one magnetometer per electric field measurement direction.

An object of the described embodiments is to provide a device for measuring the electric field in a conducting medium, or electrometer, enabling to measure the three components of the electric field, such a device having a simpler architecture than known devices capable of measuring a plurality of components of the electric field. In particular, an object of the described embodiments is to provide a device comprising a single magnetometer.

Figure 3A:
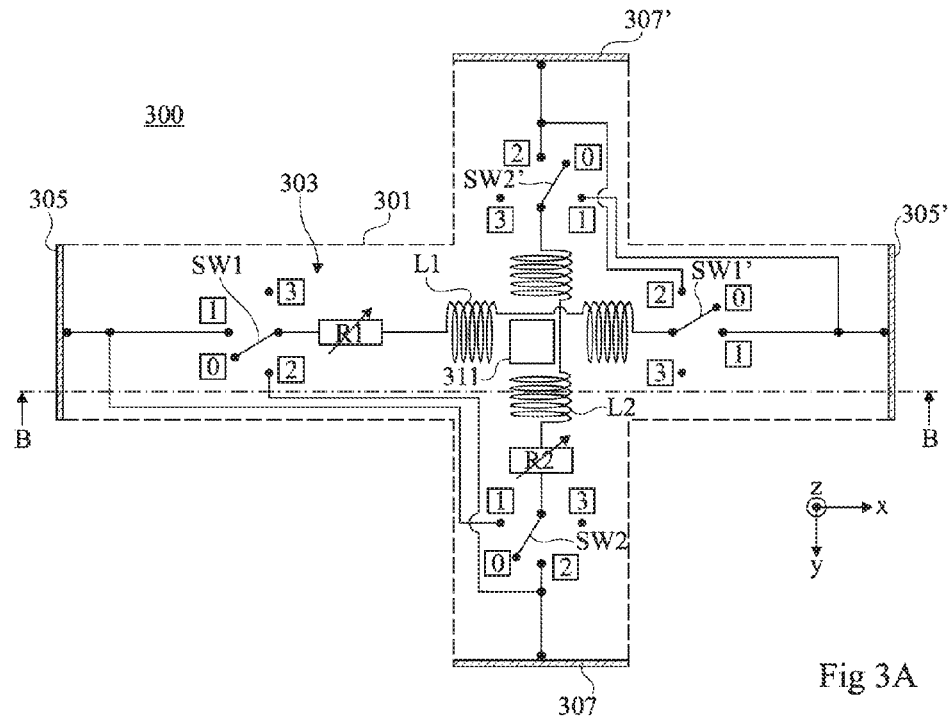
FIGS. 3A and 3B are cross-section views schematically showing an embodiment of a current-measurement electrometer.
Figure 3B:
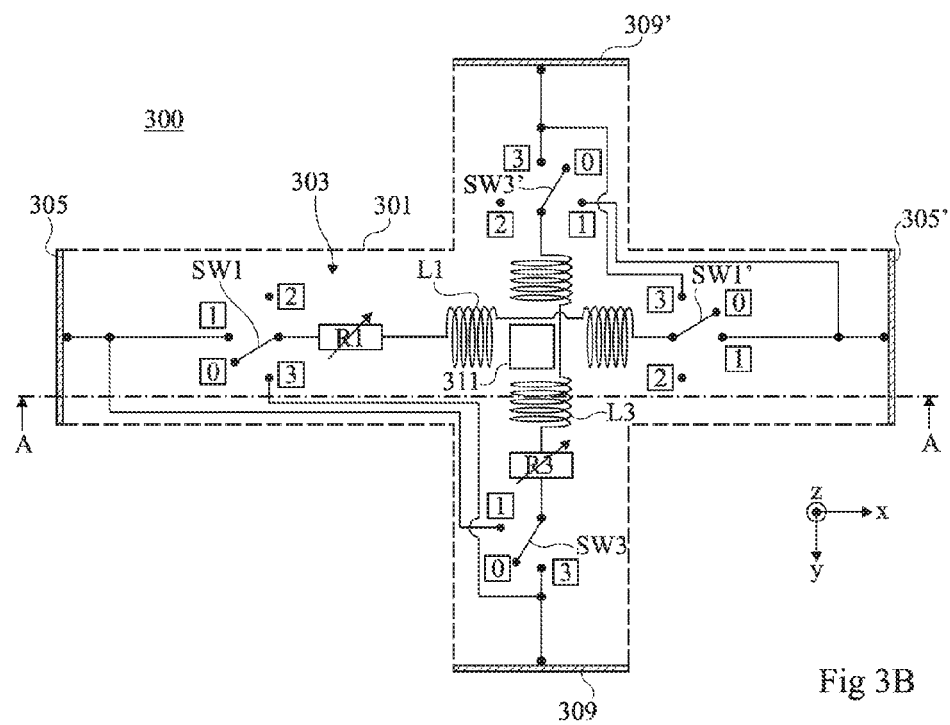

FIGS. 3A and 3B schematically show an embodiment of a current-measurement electrometer 300 intended to be placed in a conducting medium where an electric field is desired to be measured, for example, sea water. FIG. 3A is a cross-section view along plane A-A of FIG. 3B, and FIG. 3B is a cross-section view along plane B-B of FIG. 3A.

Electrometer 300 comprises a tightly closed enclosure 301, shown in dotted lines in the drawings, delimiting a volume 303 of an insulating medium, for example, air or vacuum. Three pairs of electrodes 305, 305'; 307, 307'; and 309, 309' are arranged on external walls of the enclosure, so that each electrode has a surface in contact with the conducting medium. The electrodes of a same pair are preferably parallel to each other, and are arranged on opposite surfaces of enclosure 301. In this example, electrodes 305, 305' of the first pair, electrodes 307, 307' of the second pair, and electrodes 309, 309' of the third pair are respectively centered on first, second, and third substantially orthogonal axes crossing a same point located substantially at the center of enclosure 301. Enclosure 301 for example has the general shape of an assembly of three cylinders of orthogonal axes crossing a same point located substantially at the center of each of the cylinders. The electrodes may then have the shape of disks placed on the cylinder surfaces, the electrodes of a same pair being arranged on the two opposite surfaces of a same cylinder. The described embodiments are however not limited to this specific configuration. As an example, enclosure 301 may have the general shape of an assembly of three portions of a tube having a square cross-section with orthogonal axes crossing a same point located substantially at the center of each of the tube portions. The electrodes may then have the shape of square plates placed on the transverse surfaces of the tube portions. As a variation, enclosure 301 may have the shape of a cube, the six electrodes respectively coating the six surfaces of the cube. Electrodes 305, 305', 307, 307', 309, and 309' for example have substantially the same surface area S. A same distance D separates, for example, the two electrodes of each of the three pairs of electrodes.

A measurement device located inside of enclosure 301 will now be described. The measurement device comprises a first branch comprising a coil L1 in series with a variable resistor R1, a second branch comprising a coil L2 in series with a variable resistor R2, and a third branch comprising a coil L3 in series with a variable resistor R3. The first branch comprises, connected to the end of resistor R1 opposite to coil L1, a switch SW1 with four positions enabling to connect resistor R1 either to electrode 305 (position 1), or to electrode 307 (position 2), or to electrode 309 (position 3), or to none of the electrometer electrodes (position 0) and, connected to the end of coil L1 opposite to resistor R1, a switch SW1' with four positions enabling to connect coil L1 either to electrode 305' (position 1), or to electrode 307' (position 2), or to electrode 309' (position 3), or to none of the electrometer electrodes (position 0). The second branch comprises, connected to the end of resistor R2 opposite to coil L2, a switch SW2 with four positions enabling to connect resistor R2 either to electrode 305 (position 1), or to electrode 307 (position 2), or to electrode 309 (position 3), or to none of the electrometer electrodes (position 0) and, connected to the end of coil L2 opposite to resistor R2, a switch SW2' with four positions enabling to connect coil L2 either to electrode 305' (position 1), or to electrode 307' (position 2), or to electrode 309' (position 3), or to none of the electrometer electrodes (position 0). The third branch comprises, connected to the end of resistor R3 opposite to coil L3, a switch SW3 with four positions enabling to connect resistor R3 either to electrode 305 (position 1), or to electrode 307 (position 2), or to electrode 309 (position 3), or to none of the electrometer electrodes (position 0) and, connected to the end of coil L2 opposite to resistor R2, a switch SW2' with four positions enabling to connect coil L2 either to electrode 305' (position 1), or to electrode 307' (position 2), or to electrode 309' (position 3), or to none of the electrometer electrodes (position 0).

Coils L1, L2, and L3 have longitudinal axes having different directions. As an example, coils L1, L2, and L3 have substantially orthogonal axes, crossing at a same point located substantially at the center of enclosure 301. As an example, each of coils L1, L2, and L3 has as a longitudinal axis the axis connecting at their centers the electrodes of the first, second, and third pairs of electrodes, respectively.

Electrometer 300 further comprises a single magnetometer 311 placed inside of enclosure 301, capable of measuring the magnetic field generated by the flowing of a current in any of coils L1, L2, and L3. As an example, and as shown in FIGS. 3A and 3B, each of coils L1, L2, and L3 is divided into two series-connected identical coil portions of same axis, arranged on either side of a central region of enclosure 301. Magnetometer 311 may then be arranged in the central region which is not occupied by the coil spirals.

In this example, magnetometer 311 is an absolute scalar magnetometer, that is, a magnetometer capable of delivering an absolute measurement of the module of the magnetic field. As an example, magnetometer 311 is a nuclear magnetic resonance (NMR) magnetometer or, preferably, a helium magnetometer 4 (based on the atomic spectrometry of helium 4) which has the advantage over NMR magnetometers of providing more accurate measurements, including for very low frequency fields.

The operation of electrometer 300 of FIGS. 3A and 3B will now be described.

In a first step, switches SW1, SW1', SW2, SW2', SW3, and SW3' are controlled to position 0 by a control circuit, not shown. Electrodes 305, 305', 307, 307', 309, and 309' are then disconnected from the measurement circuit, and coils L1, L2, and L3 conduct no current and thus generate no magnetic field. The only magnetic field seen by magnetometer 311 is the ambient magnetic field. Module B0 of the ambient magnetic field is measured by magnetometer 311, and stored by an analysis and processing circuit (not shown) of the electrometer. During this step or at a previous step, the orientation of the ambient magnetic field is further determined. A method of determining the direction of a magnetic field by means of a helium magnetometer 4 is for example described in the article entitled "On the calibration of a vectorial $^4$He pumped magnetometer" of O. Gravant et al. (Earth Planets Space, 53, 949-958, 2001). As a variation, the orientation of the ambient magnetic field may be previously determined by a measurement device external to the electrometer, and transmitted to the analysis and processing circuit of the electrometer.

At a second step, switches SW1, SW1', SW2, SW2', SW3, and SW3' are controlled to position 1. Electrodes 307, 307', 309, and 309' are then disconnected from the measurement circuit, and current $I_x$ collected by electrode pair 305, 305' is distributed in coils L1, L2, and L3 according to a distribution which depends on the values of resistors R1, R2, and R3. The values of resistors R1, R2, and R3 are set by a control circuit so that general magnetic field $B_x$ generated by the parallel association of coils L1, L2, and L3 is substantially collinear to the ambient magnetic field. Module B1 of the magnetic field seen by magnetometer 311, which corresponds to the sum of ambient magnetic field B0 and of the magnetic field $B_x$ generated by the coils under the effect of current $I_x$, is then measured by magnetometer 311. The analysis and processing circuit can deduce therefrom the module of magnetic field $B_x$, according to formula $B_x$=B1−B0. Knowing the electric/magnetic transfer rate of each of coils L1, L2, and L3, current $I_x$ can be deduced. Current $I_x$ corresponds to the current induced by component $E_x$ of the electric field along an axis x orthogonal to electrodes 305 and 305'. Thus, similarly to what has been explained hereabove in relation with FIG. 1, one can deduce from current $I_x$ component $E_x$ of the electric field according to formula $E_x=I_x/(S*\alpha*\sigma_e)$.

At a third step, switches SW1, SW1', SW2, SW2', SW3, and SW3' are controlled to position 2. Electrodes 305, 305', 309, and 309' are then disconnected from the measurement circuit, and current $I_y$ collected by electrode pair 307, 307' is distributed in coils L1, L2, and L3. As for the previous step, the values of resistors R1, R2, and R3 are set so that general magnetic field $B_y$ generated by the parallel association of coils L1, L2, and L3 under the effect of current $I_y$ is substantially collinear to the ambient magnetic field. Module B2 of the magnetic field seen by magnetometer 311 is then measured by magnetometer 311. The analysis and processing circuit can deduce therefrom the module of magnetic field $B_y$ according to formula $B_y$=B2−B0 and, similarly to what has been described for the second step, component $E_y$ of the electric field according to an axis y orthogonal to electrodes 307 and 307'.

At a fourth step, switches SW1, SW1', SW2, SW2', SW3, and SW3' are controlled to position 3. Electrodes 305, 305', 307, and 307' are then disconnected from the measurement circuit, and current $I_z$ collected by electrode pair 309, 309' is distributed into coils L1, L2, and L3. As for the previous step, the values of resistors R1, R2, and R3 are set so that general magnetic field $B_z$ generated by the parallel association of coils L1, L2, and L3 under the effect of current $I_z$ is substantially collinear to the ambient magnetic field. Module B3 of the magnetic field seen by magnetometer 311 is then measured by magnetometer 311. The analysis and processing circuit can deduce therefrom the module of magnetic field $B_z$ according to formula $B_z$=B3−B0 and, similarly to what has been described for the second step, component $E_z$ of the electric field according to an axis z orthogonal to electrodes 309 and 309'.

Thus, the above-mentioned steps enable to determine the three components $E_x$, $E_y$, and $E_z$ of the electric field in the conducting medium having electrometer 300 plunged into it.

Preferably, the four above-mentioned steps are repeated periodically (except for the phase of determining the ambient magnetic field, which may be carried out only once), at a sampling frequency (switching frequency of switches SW1, SW1', SW2, SW2', SW3, and SW3') at least twice greater than the maximum frequency of the electric field which is desired to be measured (Nyquist-Shannon criterion), for example, at a sampling frequency in the range from 1 to 1,000 Hz. It should be noted that impedance $Z_{elec}$ of the electrodes, used to calculate electric conductivity $\sigma_c$ of the sensor, then is the impedance at the sampling frequency of the device, which may be lower than the DC impedance.

Figure 4A:
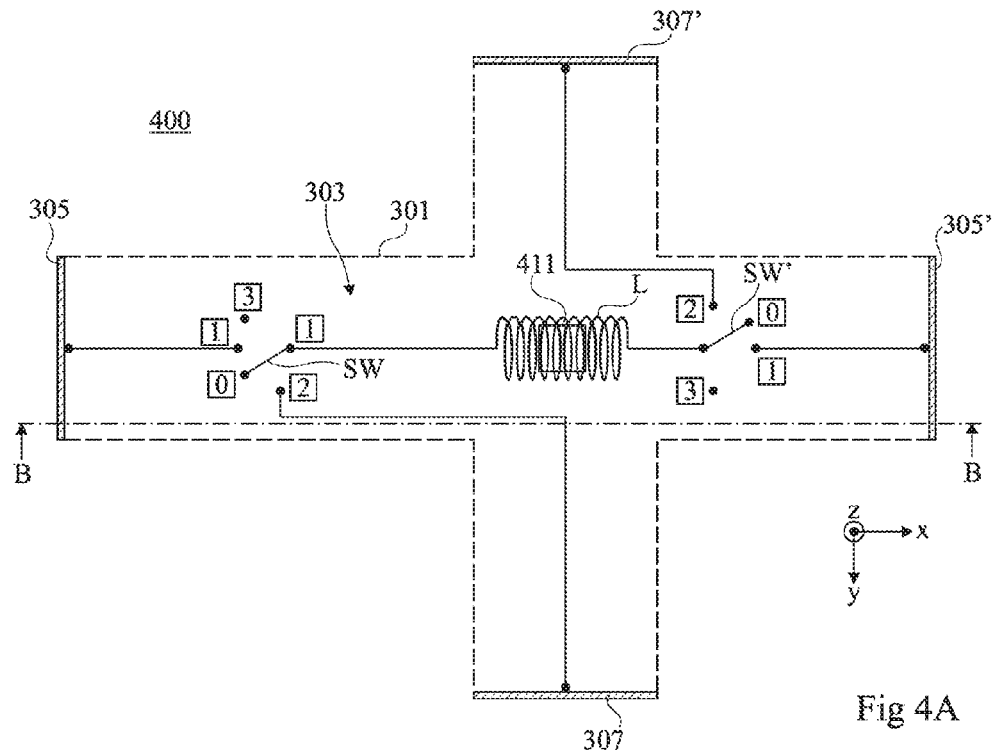
FIGS. 4A and 4B are cross-section views schematically showing another embodiment of a current-measurement electrometer.
Figure 4B:
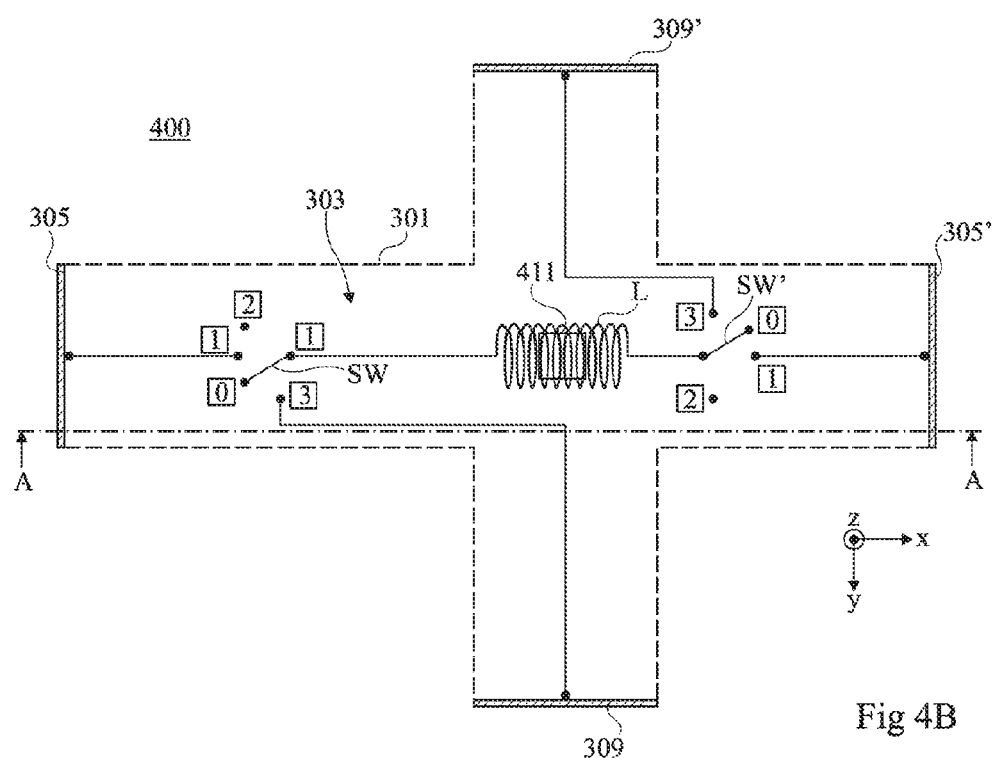

FIGS. 4A and 4B schematically show an example of another embodiment of a current-measurement electrometer 400. FIG. 4A is a cross-section view along plane A-A of FIG. 4B, and FIG. 4B is a cross-section view along plane B-B of FIG. 4A.

Electrometer 400 of FIGS. 4A and 4B comprises elements common with electrometer 300 of FIGS. 3A and 3B. These elements will thus not be described again. In the following, only the differences between electrometers 300 and 400 will be detailed.

Electrometer 400 differs from electrometer 300 essentially by its measurement device internal to insulating enclosure 301.

The measurement device of electrometer 400 comprises a single coil L. It further comprises, connected to a first end of coil L, a switch SW with four positions enabling to connect the first end of the coil either to electrode 305 (position 1), or to electrode 307 (position 2), or to electrode 309 (position 3), or to none of the electrometer electrodes (position 0), and, connected to a second end of coil L opposite to the first end, a switch SW' with four positions enabling to connect the second end of the coil either to electrode 305' (position 1), or to electrode 307' (position 2), or to electrode 309' (position 3), or to none of the electrometer electrodes (position 0).

Electrometer 400 further comprises a single magnetometer 411 placed inside of enclosure 301, capable of measuring the magnetic field generated by the flowing of a current through coil L. In the shown example, magnetometer 411 is placed inside of coil L, substantially at the center thereof.

Magnetometer 411 is a vector magnetometer, that is, a magnetometer capable of providing a measurement of the three components of the magnetic field. As an example, magnetometer 411 is a helium vector magnetometer 4 of the type described in the above-mentioned article of O. Gravant et al. As a variation, magnetometer 411 is a fluxgate magnetometer, or an induction magnetometer. It should be noted that such a magnetometer does not necessarily provide an absolute measurement of the three components of the magnetic field, but provide at least a relative measurement.

The operation of electrometer 400 of FIGS. 4A and 4B will now be described.

In a first step, switches SW and SW' are controlled to position 0 by a control circuit, not shown. Electrodes 305, 305', 307, 307', 309, and 309' are then disconnected from the measurement circuit, and coil L conducts no current and thus generates no magnetic field. Ambient magnetic field B0 is then vectorially measured by magnetometer 411, and stored by an analysis and processing circuit (not shown) of the electrometer.

At a second step, switches SW and SW' are controlled to position 1. Electrodes 307, 307', 309, and 309' are then disconnected from the measurement circuit, and current $I_x$ collected by electrode pair 305, 305' flows through coil L, inducing a magnetic field $B_x$ parallel to the axis of coil L. A magnetic field B1, corresponding to the sum of magnetic field $B_x$ and of ambient field B0, is then vectorially measured by magnetometer 411. By vector subtraction (component by component), an absolute value of field $B_x$ can be deduced therefrom. As in the example of FIGS. 3A and 3B, current $I_x$ and component $E_x$ of the electric field can be deduced from this measurement according to formula $E_x=I_x/(S*\alpha*\sigma_e)$.

At a third step, switches SW and SW' are controlled to position 2. Electrodes 305, 305', 309, and 309' are then disconnected from the measurement circuit, and current $I_y$ collected by electrode pair 307, 307' flows through coil L, inducing a magnetic field $B_y$ parallel to the axis of coil L. A magnetic field B2, corresponding to the sum of magnetic field $B_y$ and of ambient field B0, is then vectorially measured by magnetometer 411. Similarly to what has been described for the second step, the analysis and processing circuit can deduce the module of magnetic field $B_y$, the intensity of current $I_y$, and the value of component $E_y$ of the electric field.

At a third step, switches SW and SW' are controlled to position 3. Electrodes 305, 305', 307, and 307' are then disconnected from the measurement circuit, and current $I_z$ collected by electrode pair 309, 309' flows through coil L, inducing a magnetic field $B_z$ parallel to the axis of coil L. A magnetic field B3, corresponding to the sum of magnetic field $B_z$ and of ambient field B0, is then vectorially measured by magnetometer 411. Similarly to what has been described from the second step, the analysis and processing circuit can deduce therefrom the module of magnetic field $B_z$, the intensity of current $I_z$, and the value of component $E_z$ of the electric field.

Thus, the above-mentioned steps enable to determine the three components $E_x$, $E_y$, and $E_z$ of the electric field in the conducting medium having electrometer 400 plunged into it.

Preferably, the four above-mentioned steps are periodically repeated at a sampling frequency (switching frequency of switches SW, SW') at least twice greater than the maximum frequency of the electric field which is desired to be measured (Nyquist-Shannon criterion). As an example, the sampling frequency is in the range from 1 to 1,000 Hz. Impedance $Z_{elec}$ of the electrodes, used to calculate electric conductivity $\sigma_c$ of the sensor, then is the impedance at the sampling frequency of the device, which may be lower than the DC impedance.

An advantage of the described embodiments is that they enable to provide a vector measurement (3D) of the electric field, while preserving a relatively simple architecture, and in particular comprising a single magnetometer.

The embodiment of FIGS. 3A and 3B has the additional advantage of providing an absolute measurement of the ambient magnetic field.

The architecture of the embodiment of FIGS. 4A and 4B is simpler than that of the embodiment of FIGS. 3A and 3B, since it comprises a single coil (against three in the embodiment of FIGS. 3A and 3B), and does not comprise variable resistors R1, R2, and R3.

It should be noted that vector magnetometers generally have a 1/f noise, which may be disturbing to perform electric field measurements in low frequency bands. The architecture of FIGS. 4A and 4B enables to do away with this disadvantage, since the switching frequency of switches SW, SW' may be selected to be sufficiently high (for example, higher than 200 Hz) to take the 1/f noise down to an acceptable level.

The architecture of FIGS. 3A and 3B further has the advantage of being less sensitive to alignment defects than the architecture of FIGS. 4A and 4B. Indeed, in the embodiment of FIGS. 4A and 4B, it should be ascertained that the magnetic orientation of the magnetometer relative to the terrestrial field remains stable all along the measurement. Further, the alignment of magnetometer 411 relative to coil L should remain stable during the measurement.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A device for measuring an electric field in a conducting medium, comprising:
   an insulating enclosure;
   first, second, and third pairs of electrodes, the electrodes of a same pair being arranged on opposite external walls of the enclosure, and the electrodes of the first, second, and third pairs being centered on first, second, and third orthogonal axes;
   a first conductive coil;
   a first pair of switches enabling to alternately connect the first coil between the electrodes of the first, of the second, and of the third pair of electrodes; and
   a single magnetometer.

2. The device of claim 1, further comprising:
   second and third conductive coils; and
   second and third pairs of switches respectively enabling to alternately connect the second coil between the electrodes of the first, of the second, and of the third pair of electrodes, and to alternately connect the third coil between the electrodes of the first, of the second, and of the third pair of electrodes,
   wherein the magnetometer is capable of measuring a magnetic field induced by the flowing of currents in the first, second, and third coils.

3. The device of claim 2, wherein the first, second, and third coils are series-connected respectively to first, second, and third ER variable resistors.

4. The device of claim 3, comprising a control circuit capable of successively implementing the steps of:
   controlling the switches so that the first, second, and third coils are not connected to the electrodes, and measuring the module and the direction of the ambient magnetic field; and
   controlling the variable resistors so that the flowing of a current in the parallel association of a first branch comprising the first variable resistor and the first coil, of a second branch comprising the second variable resistor and the second coil, and of a third branch comprising the third variable resistor and the third coil, induces, at the level of the magnetometer, a magnetic field substantially parallel to the ambient magnetic field.

5. The device of claim 4, wherein the control circuit is further capable of successively implementing the steps of:
   controlling the switches so that the first, second, and third branches are connected in parallel between the electrodes of the first pair of electrodes and are not connected to the second and third pairs of electrodes, and then measuring the module of the magnetic field at the level of the magnetometer;
   controlling the switches so that the first, second, and third branches are connected in parallel between the electrodes of the second pair of electrodes and are not connected to the first and third pairs of electrodes, and then measuring the module of the magnetic field at the level of the magnetometer; and controlling the switches so that the first, second, and third branches are connected in parallel between the electrodes of the third pair of electrodes and are not connected to the first and second pairs of electrodes, and then measuring the module of the magnetic field at the level of the magnetometer.

6. The device of claim 2, wherein the first, second, and third coils have non-parallel longitudinal axes, for example, substantially orthogonal.

7. The device of claim 2, wherein the magnetometer is a scalar magnetometer.

8. The device of claim 1, comprising a control circuit capable of successively implementing the steps of:

controlling the switches so that the first coil is not connected to the electrodes, and performing a vector measurement of the ambient magnetic field;

controlling the switches so that the first coil is connected between the electrodes of the first pair of electrodes and is not connected to the second and third pairs of electrodes, and then performing a vector measurement of the magnetic field at the level of the magnetometer;

controlling the switches so that the first coil is connected between the electrodes of the second pair of electrodes and is not connected to the first and third pairs of electrodes, and then performing a vector measurement of the magnetic field at the level of the magnetometer; and controlling the switches so that the first coil is connected between the electrodes of the second pair of electrodes and is not connected to the first and second pairs of electrodes, and then performing a vector measurement of the magnetic field at the level of the magnetometer.

9. The device of claim 1, wherein the magnetometer is a vector magnetometer.

10. The device of claim 1, wherein the electrodes have substantially the same surface area, and wherein a same distance separates the two electrodes of each of the three pairs of electrodes.

* * * * *